(12) United States Patent  
Vahidsafa

(10) Patent No.: US 9,404,967 B2  
(45) Date of Patent: Aug. 2, 2016

(54) MIXING OF LOW SPEED AND HIGH SPEED CLOCKS TO IMPROVE TEST PRECISION OF A DIGITAL INTEGRATED CIRCUIT

(71) Applicant: Oracle International Corporation, Redwood City, CA (US)

(72) Inventor: Ali Vahidsafa, Palo Alto, CA (US)

(73) Assignee: Oracle International Corporation, Redwood City, CA (US)

( * ) Notice: Subject to any disclaimer, the term of this patent is extended or adjusted under 35 U.S.C. 154(b) by 134 days.

(21) Appl. No.: 14/535,647

(22) Filed: Nov. 7, 2014

(65) Prior Publication Data

US 2016/0131711 A1    May 12, 2016

(51) Int. Cl.
*G01R 31/02* (2006.01)
*G01R 31/317* (2006.01)

(52) U.S. Cl.
CPC .... *G01R 31/31726* (2013.01); *G01R 31/31713* (2013.01); *G01R 31/31727* (2013.01)

(58) Field of Classification Search
CPC ............... G01R 31/318536; G01R 31/318544; G01R 31/318541; G01R 31/318566; G01R 31/2815; G01R 31/307; G01R 31/31703; G01R 31/318586
See application file for complete search history.

(56) References Cited

U.S. PATENT DOCUMENTS

| | | | | |
|---|---|---|---|---|
| 6,286,121 B1 * | 9/2001 | Osawa | ........... | G01R 31/318536 714/738 |
| 2007/0061644 A1 * | 3/2007 | Birmiwal | ....... | G01R 31/318583 714/726 |

* cited by examiner

*Primary Examiner* — Tung X Nguyen  
(74) *Attorney, Agent, or Firm* — Polsinelli PC

(57) ABSTRACT

Implementations of the present disclosure involve an apparatus and/or method for mixing high speed and low speed clock signals during structural testing of a digital integrated circuit to improve the test precision and efficiency. In particular, the apparatus and/or method allow for a testing device to perform stuck-bit testing of the circuit by releasing one or more clock cycles of a low speed clock signal. Further, without having to reset the testing of the circuit, at-speed testing of the circuit may be conducted by the testing device. In one embodiment, at-speed testing occurs by activating a mode signal associated with the circuit design that instructs one or more clock cycles from an internal clock signal to the circuit to be released. The testing device may return to stuck-bit testing at a low speed clock signal, or continue with at-speed testing using the high speed internal clock signal.

20 Claims, 12 Drawing Sheets

US 9,404,967 B2

MIXING OF LOW SPEED AND HIGH SPEED CLOCKS TO IMPROVE TEST PRECISION OF A DIGITAL INTEGRATED CIRCUIT

FIELD OF THE DISCLOSURE

Aspects of the present invention relate to computing systems and, more particularly, aspects of the present invention involve an apparatus and/or method for mixing high speed and low speed clock signals during structural testing of a digital integrated circuit to improve the test precision.

BACKGROUND

It is often desirable to improve the efficiency and comprehensiveness of manufacturing testing of computer components. To ensure fast and reliable operation of a computer, manufacturing testing of each part must include some form of speed testing to show that the component is operating within the specified timing parameters.

One common method of circuit testing is known as structural testing and is typically applied to a circuit as the circuit is produced at the factory. Generally, these tests are pre-developed by the test engineers and provided to the manufacturer for use during production of the design. As such, the test typically has no knowledge of the function of the circuit itself, and the circuit is typically viewed by the testing suite as a random set of flip-flop components and logic gates. However, because structural testing provides an indication that the manufacturing of the circuit is accurate at the intended speed, a more precise analysis of the circuit can be achieved through a more precise control of clock during structural testing.

In structural testing, an input test pattern is scanned into the logic of a digital circuit, a number of clock pulses are issued to advance the state, and then the final state is scanned out and compared to an expected output pattern to determine if the logic of the circuit is operating correctly. Generally, there are two types of structural testing performed on computer circuits. The first type of structural test, known as stuck-bit testing, issues a single clock pulse before scanning out the state and analyzing the result. This type of test is frequently used to determine manufacturing defects of the logic of the circuit which are speed independent. Another type of stuck-bit testing issues more than a single clock pulse. However, the clock pulse used in this type of testing is generally a far lower frequency than the intended operating frequency of the circuit under test.

The second type of structural test, known as at-speed test, issues two or more clock pulses at the expected operating frequency of the circuit. This type of test is used frequently to determine if the circuit operates correctly at the frequency of the clock signal. In other words, at-speed testing determines accuracy of the circuit based on the anticipated clock frequency for the circuit. Due to the differences in these types of testing, a testing device will perform two different test runs, which often requires the circuit designer to provide two different test patterns to the manufacturer. At-speed testing of circuits which require more than two clock pulses may suffer from negative voltage affects, known as voltage droop, which distorts the results of a multi-cycle test at the later cycles of the test, making the test results less accurate.

It is with these and other issues in mind that various aspects of the present disclosure were developed.

SUMMARY

One implementation of the present disclosure may take the form of a method of testing of a microelectronic circuit. The method may include the operation of scanning in a test pattern into the microelectronic circuit through one or more inputs to the microelectronic circuit, followed by transmitting one or more pulses of a first clock signal to the microelectronic circuit, the first clock signal being from a first clock source to the microelectronic circuit. In addition, prior to scanning out a final value of the transmitted one or more pulses of the first clock signal, the operations may include a asserting a mode change signal associated with the microelectronic circuit, the mode change signal indicating a change in clocking logic applied to the microelectronic circuit, enabling a second clock signal to the microelectronic circuit, the second clock signal being from a second clock source to the microelectronic circuit, the second clock source different than the first clock source, transmitting one or more pulses of the second clock signal to the microelectronic circuit and scanning out the final value and comparing the final value to an expected result.

Another implementation of the present disclosure may take the form of a computer system that includes a microelectronic circuit coupled to a testing device for conducting testing of circuit designs, the microelectronic circuit comprising a plurality of clock domains, each clock domain within the plurality comprising one or more test control circuits and an operating clock component. The testing device is electrically connected to the microelectronic circuit and is configured to scan in a test pattern into the microelectronic circuit through one or more inputs to the microelectronic circuit and transmit one or more pulses of a first clock signal to the microelectronic circuit, the first clock signal being from a first clock source to the microelectronic circuit. The testing device is also configured to, prior to scanning out a final result of the transmitted one or more pulses of the first clock signal, assert a mode change signal associated with the microelectronic circuit, the mode change signal indicating a change in a clocking mode applied to the microelectronic circuit, enable a second clock signal to the microelectronic circuit, the second clock signal being from a second clock source to the microelectronic circuit, the second clock source different than the first clock source, transmit one or more pulses of the second clock signal to the microelectronic circuit, and compare the received result value to an expected result.

DETAILED DESCRIPTION

Implementations of the present disclosure involve an apparatus and/or method for mixing high speed and low speed clock signals during structural testing of a digital integrated circuit to improve the test precision and efficiency. In particular, the apparatus and/or method allow for a testing device to perform stuck-bit testing of the circuit by releasing one or more clock cycles of a low speed clock signal. Further, without having to initialize the test control logic, at-speed testing of the circuit may be conducted by the testing device. For example, after scanning in the pattern into the circuit, a mixture of slow and fast clock signals may be applied to the circuit to conduct the testing of the circuit. In one embodiment, at-speed testing occurs by activating a mode signal associated with the test control logic of the circuit that instructs one or more clock cycles from an internal high speed clock source to be released. The testing device may then return to stuck-bit mode to use a low speed clock signal, or continue with at-speed testing using the internal high speed clock signal. This mode change may occur before or after scanning in a new pattern, and does not require initializing the test control logic. In this manner, testing of the digital circuit may occur through arbitrary mixing of a low speed clock signal for stuck-bit testing and a high-speed clock signal for transitional testing at will. It is also possible to conduct multi-cycle tests which include a mixture of both slow and fast clock signals. Such testing may reduce the number and times of structural tests conducted on the circuit, as well as address certain negative voltage loop effects that occur on circuits under such tests.

Figure 1:
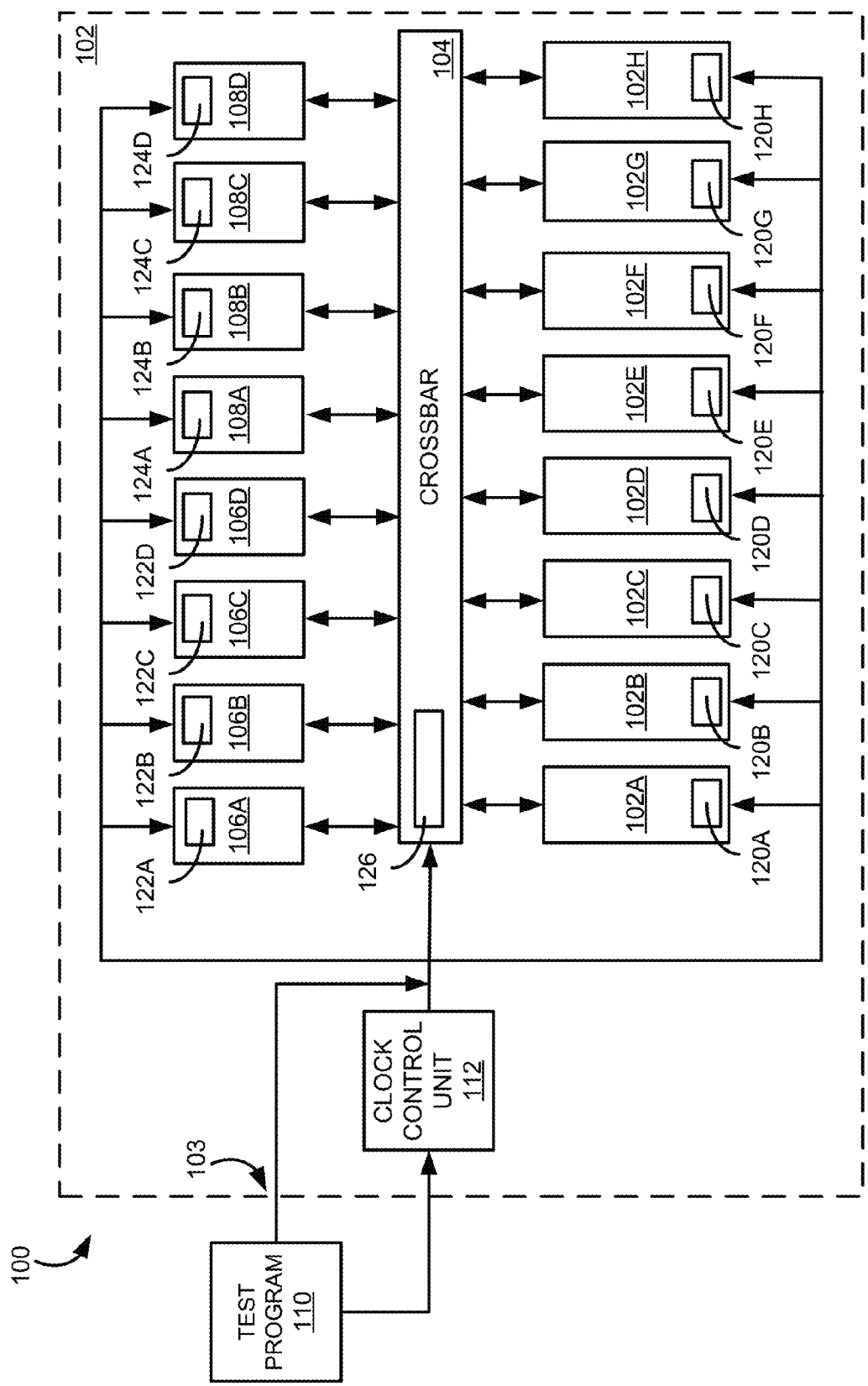
FIG. 1 is a circuit diagram illustrating an example of a test set-up for testing a microprocessor design which may be used in implementing embodiments of the present disclosure.

FIG. 1 is a circuit diagram illustrating an example of a test set-up for testing a microprocessor design which may be used in implementing embodiments of the present disclosure. In particular, the microelectronic design of FIG. 1 is a portion of a microprocessor design, illustrating several clock domains of the design. For example, the processor 102 of FIG. 1 includes several processor cores 102A-H, a crossbar 104, several memory interfaces 106A-D, several input/output interfaces 108A-D, and the like. Each of the components of the processor 102 may communicate through the crossbar 104 such that data may be provided from one component to another for processing of the data. It should be appreciated that several components of the overall processor 102 are not illustrated in FIG. 1. Rather, the design used herein is to simplify the discussion of the present disclosure. In one particular example, the microelectronic design may include eight core-groups, with each core-group including four cores. Thus, a total thread count per core-group of this particular microelectronic circuit may be 32, for a combined thread count of 256 operational threads.

In general, the circuit design includes a plurality of processor cores 102A-H. Each of the cores 102A-H may couple to an interconnect network (or "crossbar") 110 for communication and transmission of data to and from other components of the circuit 102. The cores 102A-H may be configured to execute instructions and to process data according to a particular instruction set architecture (ISA). As shown in FIG. 1, each of the cores 102A-H may be configured to operate independently of the others, such that all the cores 102A-H may execute code in parallel. Additionally, in some embodiments each of the cores 102A-H may be configured to execute multiple threads concurrently, where a given thread may include a set of instructions that may execute independently of instructions from another thread. For example, an individual software process executing on the computer system 102, such as an application, may consist of one or more threads that may be scheduled for execution by an operating system. In some implementations, each of the cores 102A-H may be configured to concurrently execute instructions from eight threads, for a total of 64 threads concurrently. In addition, while the present disclosure discusses a multi-core processor, the embodiments described may also be utilized by a single core processor.

The crossbar 110 may be configured to manage data flow between the cores 102A-H one or more other components of the circuit design 102. In some embodiments, the crossbar 110 may include logic (such as multiplexers or a switch fabric, for example) that may allow any core 102A-H to access any other component, and that conversely may allow data to be returned from the component to any core 102A-H. Further, the crossbar 210 may coordinate communication between the cores 102A-H when the cores are operating under different clock signals.

The circuit design 102 may also include other clock domains. For example, the circuit 102 may include one or more memory interfaces 106A-D and one or more input/output (I/O) interfaces 108A-D. The memory interfaces 106A-D may provide access to memory components (not shown) associated with the circuit design 102 to the components of the circuit. Similarly, I/O interfaces 108A-D may provide access to I/O components (not shown) associated with the circuit design 102 to the components of the circuit. It should be appreciated, however, that no one component of the design 102 illustrated in FIG. 1 is necessary for the present disclosure to operate. For example, in some embodiments, the crossbar 104 may be omitted, such as may be the case with a single core processor. Thus, the components of the circuit 102 are used herein to merely illustrate that various components of the circuit may operate on different clock frequencies, creating a plurality of clock domains within the circuit design. Through the present disclosure, the different clock domains of the circuit 102 may be tested simultaneously by a test program 110, discussed in more detail below.

The timing or clock signals within the processor 102 may be provided with a clock control unit (CCU) 112. As shown in FIG. 1, the CCU 112 may be coupled to the cores 102A-H, the crossbar 110 and the other components 106A-D, 108A-D. During operation, the CCU 112 may provide a plurality of timing or clock signals to the various blocks within the circuit 102. Alternatively, each clock domain of the circuit 102 may have a clock generating component that is activated by one or more signals from the CCU 112. For example, the crossbar 104 may operate at a first frequency by a clock generating component within the crossbar. The clock generating component of the crossbar 104 may be activated from an enable signal from the CCU 112. In the example of the microelectronic circuit discussed above, each core-group of the circuit may be a different clock domain of the circuit with its own CCU 112.

The actual clock generation circuitry within the CCU 112 or within each clock domain of the circuit 102 may take a variety of physical forms, including in some embodiments, a crystal based oscillator with relatively low phase noise and/or clock jitter. In other embodiments, the clock generation circuitry may be a frequency synthesized signal based on a crystal oscillator signal, such as a phase locked loop (PLL) synthesizer or a delay-locked-loop (DLL) synthesizer or a frequency-locked-loop (FLL). Since the PLL and/or DLL and/or FLL are feedback and control loops that may synthesize a clock signal, upon their initialization, a significant amount of time may be allowed to elapse before the PLL and/or DLL and/or FLL "lock", and provide a stable output clock signal to each of the clock domains of the circuit 102. As such, mixed mode clocking may include control logic such that changing mode, performing scan, and releasing clock pulses in either mode does not compromise the locked state of the PLL and/or DLL and/or FLL. In addition, the example of the microelectronic circuit discussed above may control each CCU of the circuit with a common mode signal provided by the testing device 110. Thus, in stuck-bit testing, all CCUs are in stuck-bit mode. Similarly, in at-speed testing, all CCUs are in at-speed testing. However, in some embodiments, each CCU of the circuit is independently controllable so that the CCUs may be in a separate testing mode at any one time.

During manufacturing phase of the processor 102, each part of the circuit may go through a series of tests, known as structural testing. Thus, a testing device or test program 110 as shown in FIG. 1 is connected to the circuit 102 to initiate the testing and obtain the testing results. For example, during structural testing, the testing device connects to the design 102 to drive one or more scan chains and control signals to the design to perform the testing of the design. Further, the testing device 110 may receive one or more scan chains that are driven by the design during the testing, compare the received value against an expected result and provide the results to a test administrator for analysis. In particular to the circuit 102 of FIG. 1, the tester may also connect to the CCU 112 of the circuit to initialize and control the clock signals used during testing. Thus, while only shown as being connected to the circuit 102 at the CCU 112, it should be appreciated that the tester may connect to the circuit in several locations, to scan in test values and receive the results of the test. However, for the present description, a test program 110 created and/or executed by the testing device connected to the circuit 102 may communicate with the CCU 112 of the circuit.

During structural testing, the testing device 110 connects to the processor 102 to drive one or more scan chains and provide control signals to the processor to perform the testing of the processor. Further, the testing device 110 may receive one or more scan chains driven by the design during the testing, compare the received value against an expected result and provide the results to a test administrator for analysis. As discussed above, some control signals that are provided by the testing device 110 are clock or clock control signals directed at the various clock domains of the design to control releasing of clock pulses for testing. In one embodiment, the testing device 110 provides clock control signals to the CCU 112 of the circuit 102 to control the clock pulses triggered during the test. In another embodiment, the testing device 110 controls the clock pulses directly through a clock pin 103 of the circuit or chip. Through this clock pin 103, the testing device 110 may provide a signal to a section of the circuit under test 102 which is asserted then de-asserted to mimic one clock pulse. As explained in more detail below, this clock signal from the testing device 110 through the clock pin 103 typically is provided at a very low frequency in comparison to the operating frequency of the circuit.

The test program 110 may be a software program created by the structural testing device connected to the circuit 102 based on one or more test parameters set out by a test moderator. In the embodiment of the test system illustrated in FIG. 1, one or more control circuits 120A-126 associated with the various clock domains of the circuit may be utilized to test each clock domain with the internal clock to each domain when a particular signal from the CCU 112 is received at the clock domain. In particular, each core 102A-H may include an associated core test control circuit 120A-H, each memory interface component 106A-D may include an associated memory interface test control circuit 122A-D, each I/O interface 108A-D may include an associated I/O interface test control circuit 124A-D, and the crossbar 104 may include a crossbar test control circuit 126. In general, each clock domain of the circuit 102 may include an associated test control circuit, regardless of the number of clock domains within the circuit.

As mentioned above, structural testing of a portion of the circuit 102 may include stuck-bit testing. During stuck-bit testing, a test value is scanned into the circuit portion, one or more slow clock pulses are issued by the testing device 110, and a result is scanned out of the circuit portion for analysis. Stuck-bit testing is configured to detect errors in the manufacturing of the circuit that are not time-sensitive, such as a wire in the circuit due to a defect is set to high. As such, the clock pulses issued during stuck-bit testing are not required to be at a certain frequency. Rather, the testing device 110 may use a clock pin 103 associated with the circuit to create the pulse that is used during the test. Because of the type of error that this test is designed to detect, the time utilized by the testing device 110 to assert and then de-assert the clock pin 103 is generally irrelevant as the error will occur regardless of the frequency of the clock pulse. As explained in more detail below, certain components of the circuit that do not have a scan-in or scan-out feature on every storage element (such as static random access memory (SRAM) components) may require more than a single clock pulse to conduct the test. Regardless of the number of clock pulses required to conduct the testing, however, stuck-bit testing is typically not dependent on the frequency of the clock signal.

Figure 2:
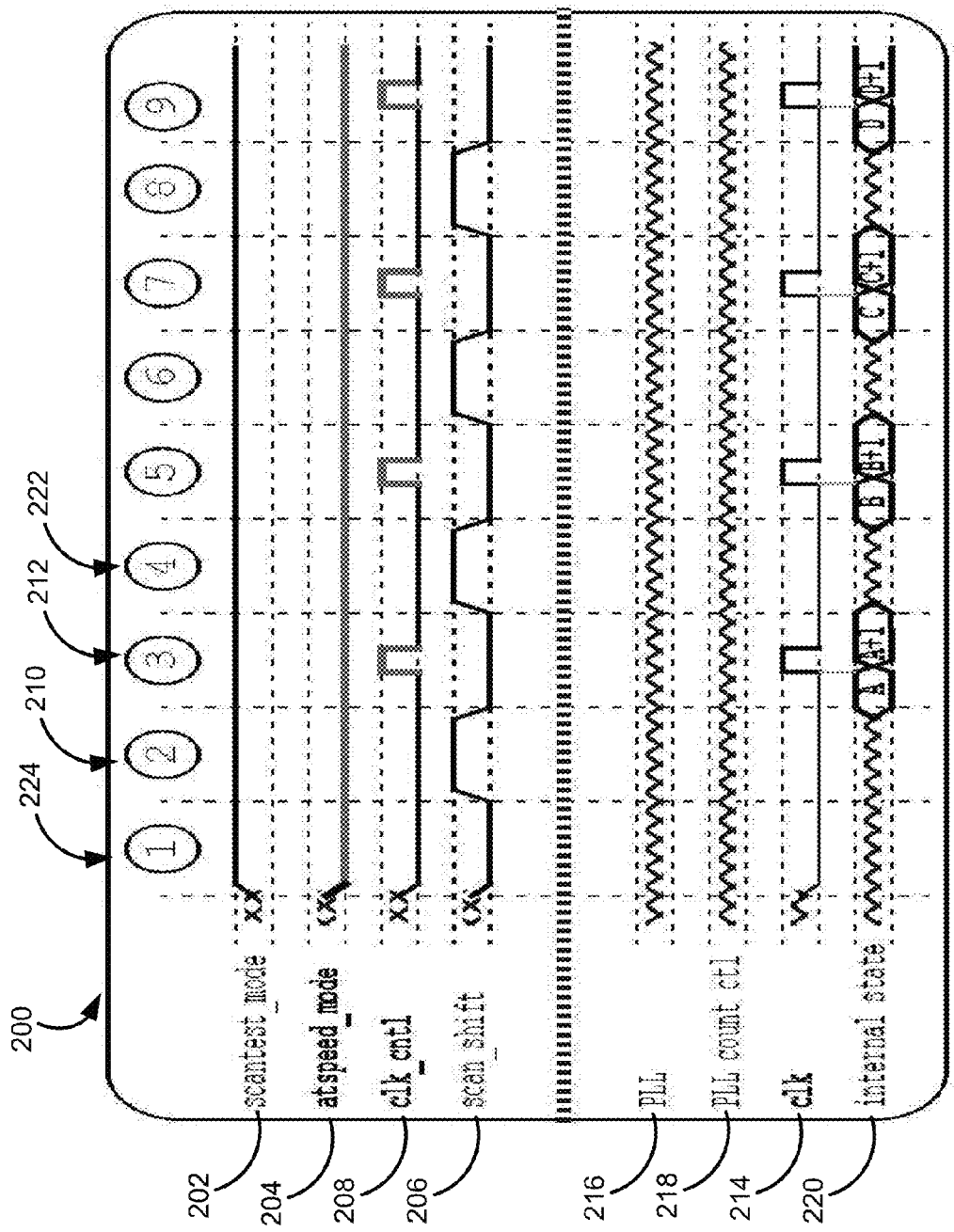
FIG. 2 is a timing diagram illustrating the signals utilized in one embodiment of stuck-bit testing of a digital circuit.

FIG. 2 is a timing diagram 200 illustrating the signals utilized in one embodiment of stuck-bit testing of a digital circuit. In general, the signals in the upper half of the timing diagram 200 of FIG. 2 are provided by the testing device 110 to which the circuit 102 under test is connected and the signal in the lower half of the timing diagram illustrate signals within the circuit under test in response to the signals provided by the testing device. Further, although the signals of the timing diagram 200 are illustrated (and discussed below) as either asserted or de-asserted at a particular time, it should be appreciated that the signals may be reversed from the assertion shown and still operate as described.

In the example shown, at time 224, the testing device 110 may perform an initialization phase of the test on the circuit. During the initialization phase, the PLL clock signal 216 and the PLL count control signal 218 are left uninitialized, as illustrated in the timing diagram 200 by the hashed lines of the signals. After initialization, the testing device 110 or testing program provides an asserted scan test mode signal 202 that indicates that the circuit is undergoing scan testing and a de-asserted at-speed mode signal 204 that indicates that the type of scan test being conducted is stuck-bit testing and not at-speed testing. In addition, the testing device 110 or program provides an asserted scan shift signal 206 that begins the process of scanning in the test pattern into the circuit. The first scan in of a test pattern occurs at time 210 indicated in the timing diagram 200. Once the test pattern is scanned in, the testing device 110 may assert a clock control signal 208 to the circuit to propagate the new value through the circuit. As mentioned above, in one embodiment the testing device 110 provides this testing signal directly to the circuit through a clock pin 103 of the circuit. In another embodiment, the clock control signal 208 is provided by the circuit clock.

In response to the clock control signal 208, a clock signal 214 of the circuit 102 under test is asserted at the same or a similar time that the clock control signal 208 is asserted. As can be seen at time 212, the clock signal 214 is the same as the clock control signal 208, indicating that the clock signal provided by the testing device 110 propagates the new value through the circuit 102. As can also be seen in the timing diagram 200, the PLL clock signal 216 of the circuit under test and the PLL count control signal 218 are not functional due to the test being a stuck-bit test. Thus, the frequency of the clock signal 214 is determined and driven by the clock control signal 208 provided by the testing device. An internal state 220 is also illustrated in the timing diagram 200, representing the totality of the internal flip-flops with scan. At completion of scan, this value 220 represents the scanned in test pattern, and at the beginning of the next scan, it represents the results of applying the clock signal 214 to the circuit. In general, the scanned in test pattern 220 and results may be known and analyzed by the testing device to conduct the stuck-bit testing of the circuit. As such, at time 222, the scan shift signal 206 is asserted to scan out the results of the stuck bit testing (illustrated as value "A+1" in the diagram) and a new scan pattern is scanned into the circuit (illustrated as value "B" in the diagram). The result scanned out may then be analyzed by the testing device 110 to determine if the circuit 102 is operating properly under the stuck-bit parameters. In this manner, a series of test patterns may be scanned into the circuit, subjected to one clock pulse (to advance the state of the logic in the circuit) and scanned out for analysis by the testing device. In general, the stuck-bit testing illustrated in FIG. 2 is performed to test one or more logic gates of the circuit under test.

Figure 3:
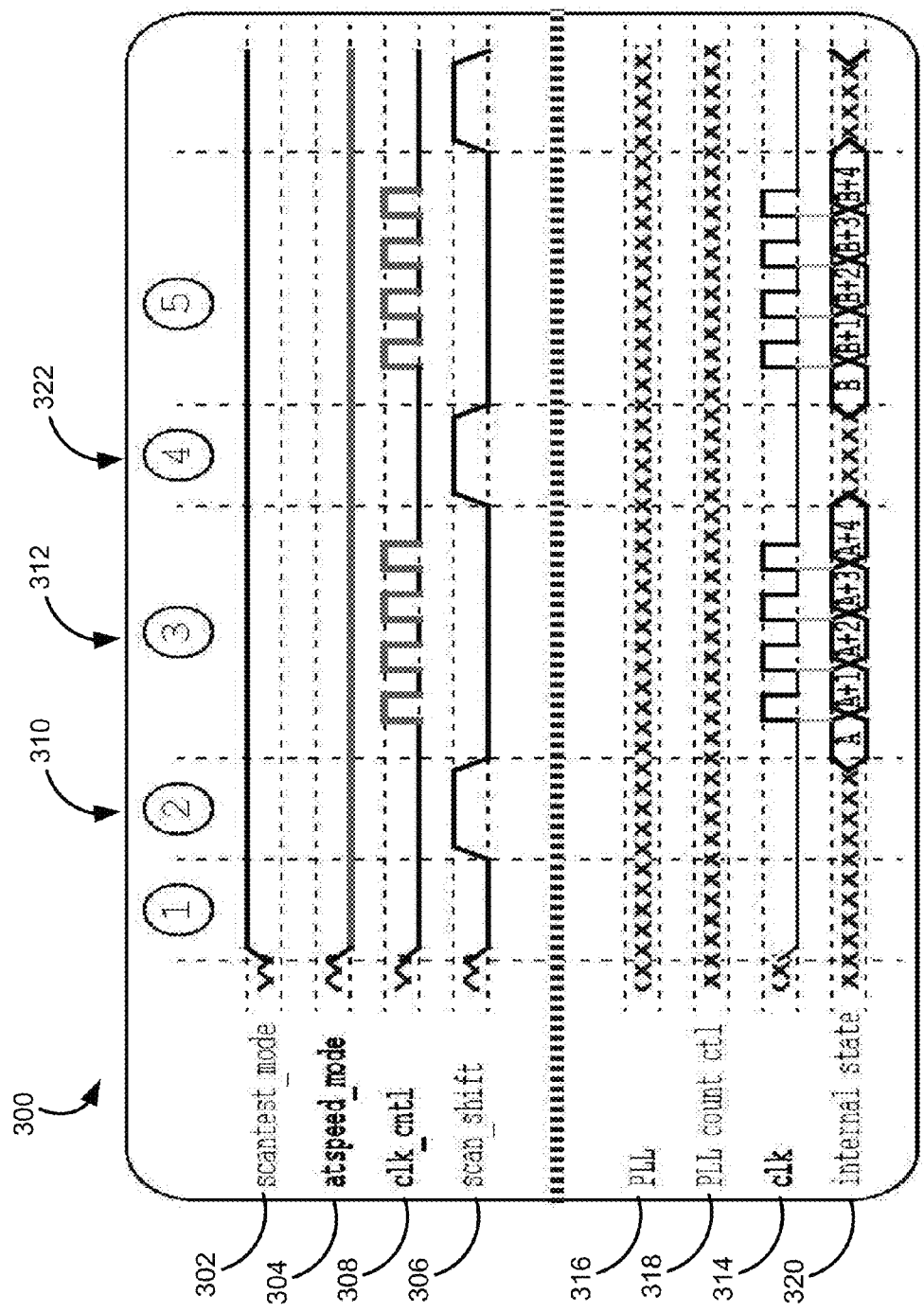
FIG. 3 is a timing diagram illustrating the signals utilized in another embodiment of stuck-bit testing of a digital circuit.

As described above, some components of a circuit under test may not have a scan-in feature that allows for the direct set-up of a test value in the components. For example, some SRAM components of a circuit may not provide a scan function on their internal storage array. In these situations, multiple clock pulses may be utilized to propagate the test pattern into and out of these components. One example of a slow-speed or stuck-bit testing of such components is illustrated in the timing diagram of FIG. 3. Similar to the timing diagram 200 of FIG. 2, the signals in the upper half of the timing diagram 300 of FIG. 3 are provided by the testing device 110 to which the circuit 102 under test is connected and the signals in the lower half of the timing diagram illustrate signals within the circuit under test in response to the signals provided by the testing device. Further, although the signals of the timing diagram 300 are illustrated (and discussed below) as either asserted or de-asserted at a particular time, it should be appreciated that the signals may be reversed from the assertion shown and still operate as described.

Similar to the timing diagram of FIG. 2, the timing diagram of FIG. 3 includes an asserted scan test mode signal 302 that indicates that the circuit is undergoing scan testing and a de-asserted at-speed mode signal 304 that indicates that the type of scan test being conducted is stuck-bit testing and not at-speed testing. In addition, an asserted scan shift signal 306 is provided that begins the process of scanning in the test pattern into the circuit. The first scan in of a test pattern occurs at time 310 indicated in the timing diagram 300. Once the test pattern is scanned in, the testing device 110 may assert a clock control signal 308 to the circuit to propagate the scan chain through the circuit. However, rather than providing a single clock pulse to the circuit, the clock control signal 308 provides several clock pulses, as indicated at time 312 of the timing diagram. These clock control signals 308 control a similar clock signal 314 in the circuit to propagate the scanned in test pattern through the components under test. The results of the propagation of the scanned in test pattern can be seen in the internal state value 320 of the circuit that starts with value "A" advancing to "A+1" through "A+4" with each successive clock pulse. It should be noted, however, that the clock control signal 308 may provide any number of clock signals to the circuit to advance the test pattern through the circuit. At time 322, test result "A+4" is scanned out (due to the asserted scan shift signal 306) and test pattern "B" is scanned in to conduct the next test based on test pattern "B".

In a similar manner, transition testing of the circuit 102 may also be conducted. However, under transition testing, the clock signal that drives the testing is provided from the internal clock signal of the circuit. Rather, because the purpose of the transition testing is to determine if the circuit operates properly at the frequency of the internal clock to the circuit, the internal clock signal is utilized by the testing device 110. To utilize the internal clock signal, the testing device 110 may transmit one or more clock control signals to the internal clock of the circuit to instruct the clock to release two or more clock pulses. These clock pulses then drive the scanned in test pattern through the circuit portion "at-speed", at which point the resulting value is scanned out of the circuit and analyzed by the testing device 110.

Figure 4:
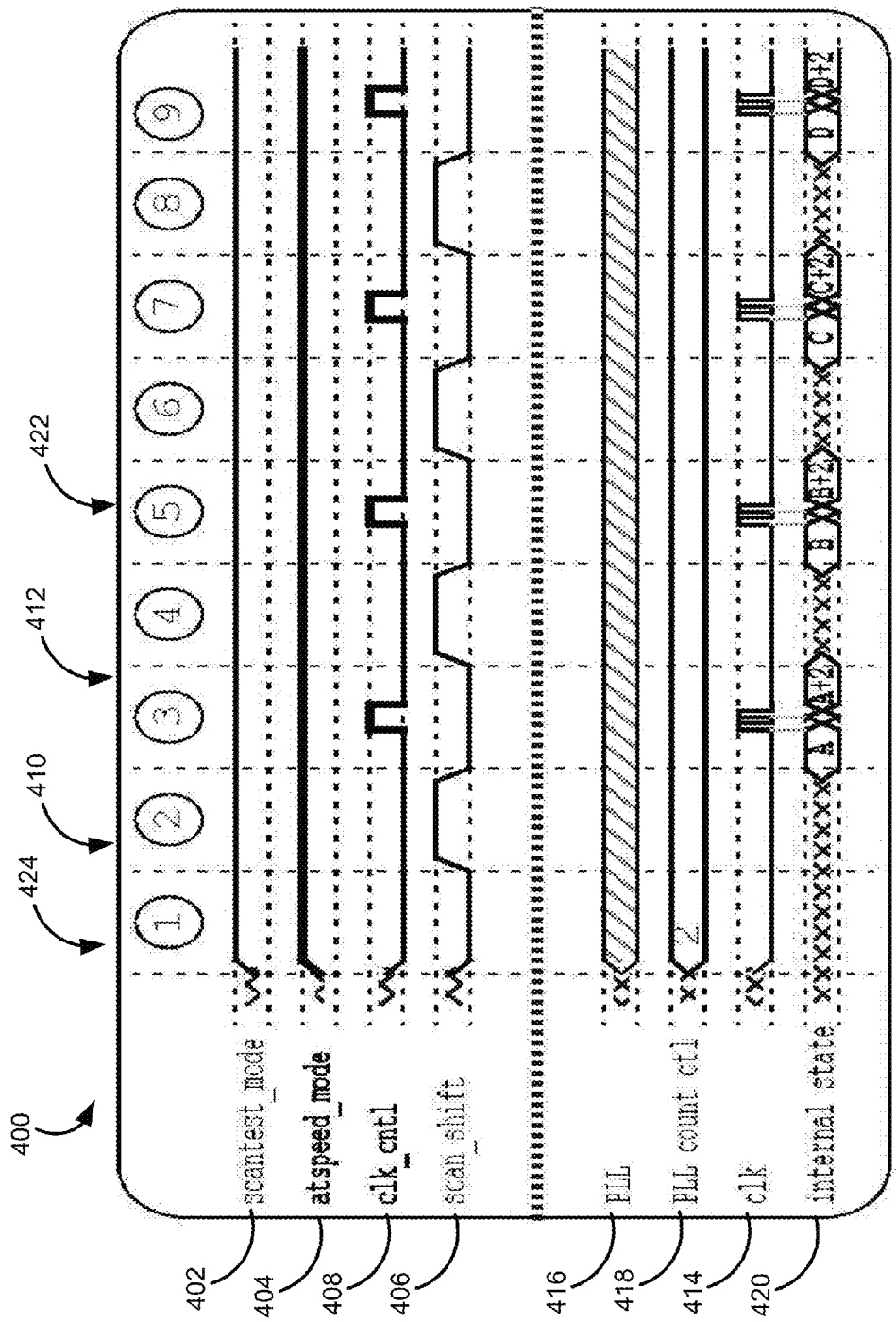
FIG. 4 is a timing diagram illustrating the signals utilized in one embodiment of at-speed testing of a digital circuit.

One example of such transition testing, or at-speed testing, of a circuit is illustrated in the timing diagram 400 of FIG. 4. Similar to above, the signals in the upper half of the timing diagram 400 of FIG. 4 are provided by the testing device 110 to which the circuit 102 under test is connected and the signal in the lower half of the timing diagram illustrate signals within the circuit under test in response to the signals provided by the testing device. Further, although the signals of the timing diagram 400 are illustrated (and discussed below) as either asserted or de-asserted at a particular time, it should be appreciated that the signals may be reversed from the assertion shown and still operate as described.

In the example shown, at time 424, the testing device 110 may perform an initialization phase of the test on the circuit. Contrary to the initialization phase described above with reference to FIG. 2, the initialization phase in this test initializes the PLL clock signal 416 and the PLL count control signal 418 as these signals are used during at-speed testing. After initialization, the testing device 110 or testing program provides an asserted scan test mode signal 402 that indicates that the circuit is undergoing scan testing. However, in this example, an asserted at-speed mode signal 404 is provided to the circuit to indicate that the type of scan test being conducted is at-speed testing and not stuck-bit testing. Similar to the tests described above, the testing device 110 or program provides an asserted scan shift signal 406 that begins the process of scanning the test pattern into the circuit. The first scan in of a test pattern occurs at time 410 indicated in the timing diagram 400. Once the test pattern is scanned in, the testing device 110 may assert a clock control signal 408 to the circuit to propagate the test pattern through the circuit. As explained in more detail below, the clock control signal 408 activates one or more clock pulses internal to the circuit to conduct the at-speed testing of the circuit.

Because at-speed testing attempts to test the circuit at the operating speed of the circuit, the PLL 416 of the circuit and a PLL count control signal 418 are illustrated in the timing diagram 400. In general, the PLL signal 416 is the internal clock signal for the circuit. The PLL count control signal 418 is, in general, a programmable value that determines how many PLL clock pulses are released within the circuit when an asserted clock control signal 408 from the testing device is received. For example, the PLL count control signal 418 of the timing diagram 400 of FIG. 4 is the value "2". It should be appreciated, however, that the PLL count control value 418 may be any number as programmed by the testing device, test administrator, or circuit to conduct the at-speed testing of the circuit.

In response to the asserted clock control signal 408, the circuit 102 under test experiences one or more PLL clock pulses, based on the PLL clock signal 416 and the PLL count control signal 418. For example, at time 412, the clock control signal 408 is asserted by the testing device. As a result of this assertion, the clock signal 414 of the circuit under test receives two PLL clock pulses. The clock signal 414 is thus the PLL clock signal 416 constrained by the PLL count control value 418, in this case "2". As a result, the scanned in test pattern is advanced for the two PLL clock pulses, as shown in internal state signal 420 as the state "A" advances to "A+2" based on the two clock pulses. In addition, the transition from "A+1" to "A+2" occurs "at-speed" because the two clock edges which cause the transition to "A+1" and to "A+2" occur at the expected frequency of the circuit. The resulting final value "A+2" is scanned out of the circuit at time 422 in response to the asserted scan shift signal 406 and a new test pattern "B" is scanned in. In this manner, a series of test patterns may be scanned into the circuit, at-speed tested for a predetermined number of PLL clock pulses (as programmed in the PLL count control signal 418) and scanned out for analysis by the testing device. In general, the at-speed testing illustrated in FIG. 4 is performed to test one or more logic gates of the circuit under test.

Figure 5:
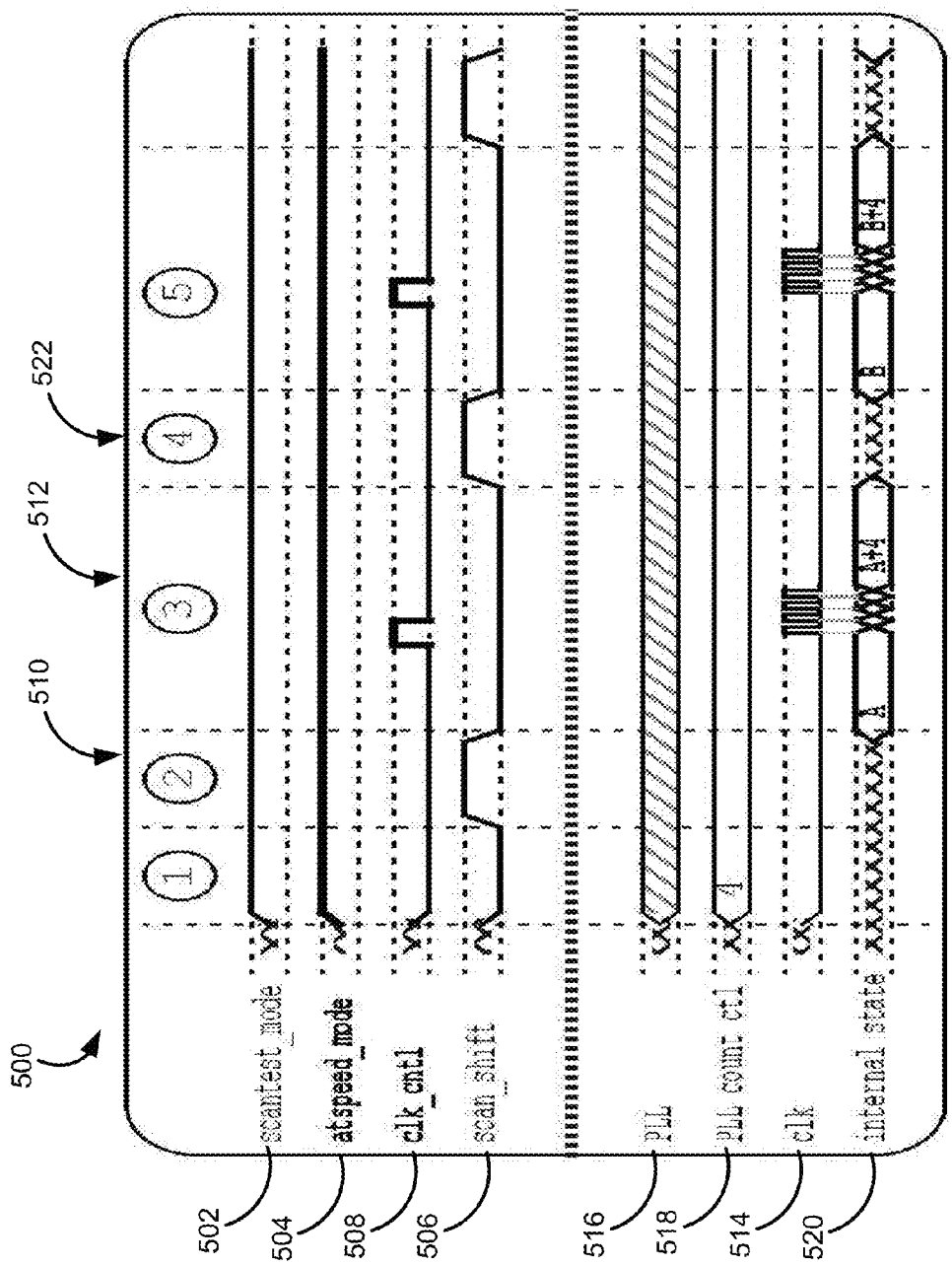
FIG. 5 is a timing diagram illustrating the signals utilized in another embodiment of at-speed testing of a digital circuit.

As described above, at-speed testing may also be conducted by releasing any number of PLL clock pulses. For example, FIG. 5 illustrates a timing diagram 500 that utilizes four PLL clock pulses to conduct the at-speed testing. Such testing may be utilized to test components such as SRAM that use multiple clock pulses to propagate the test value through. In general, the operation of the testing device and circuit is the same as that described above with reference to the timing diagram of FIG. 4. However, in this example, the PLL count control signal 518 is illustrated as value "4". This indicates that four PLL clock pulses 516 are released into the circuit at each assertion of the cock control signal 508 from the testing device. As shown at time 512, these four clock pulses advance the state four times. Operation of the testing device and the circuit to conduct the at-speed testing with four PLL clock pulses is similar to that described above.

While generally effective to determine manufacturing defects in the circuits, the structural testing described above may have some inherent imprecision, especially for those circuit components that do not include a scan feature such that multiple clock pulses are used to propagate the effect of the test pattern through. One particular undesired effect is known as voltage droop. In general, voltage droop is a drop in voltage to a component or circuit when there is a sudden surge of activity in the circuit. One example of such a surge occurs in structural testing when a clock pulse is applied to the component. As such, the voltage observed by a particular component at later clock pulses is typically less than the voltage observed by the component at the earlier clock pulses. In addition, the voltage droop experienced at a component is larger for higher frequency clock signals than lower frequency clock signals as the component has less time to recover the voltage between the clock pulses.

Figure 6:
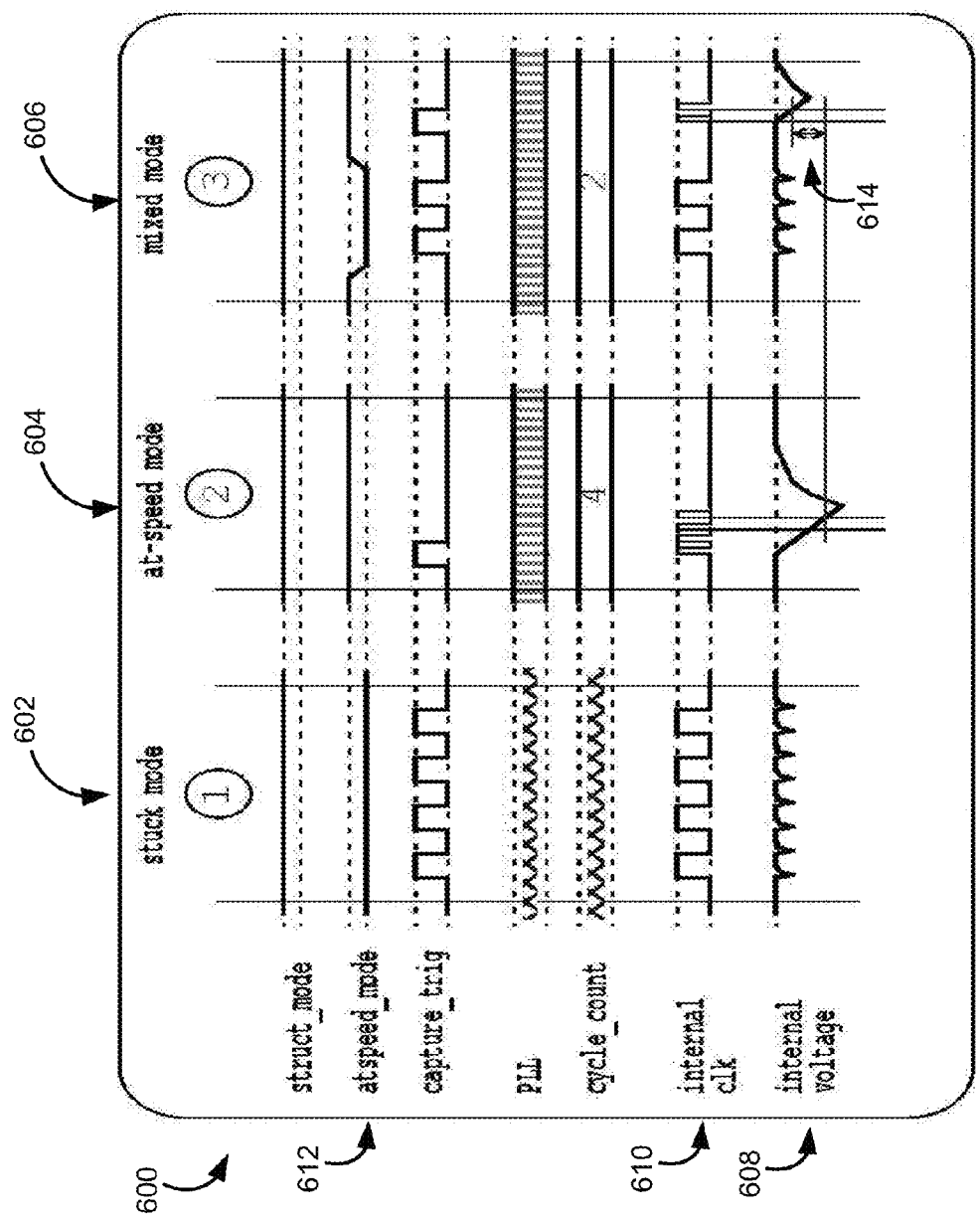
FIG. 6 is a timing diagram illustrating voltage droop in an internal voltage of a digital circuit during various structural tests.

The voltage droop effect for the different structural testing described herein is illustrated in FIG. 6. For example, column 1 of the timing diagram of FIG. 6 illustrates the voltage droop effect during stuck-bit testing. In general, the circuit's internal voltage 608 is stable when the internal clock 610 of the circuit is stopped as there is no circuit activity. However, during the toggling of the clock signal 610, some activity in the circuit occurs, thereby causing a temporary internal voltage droop. In the diagram 600, the droop is shown as a downward sharp pulse on the internal voltage signal 608. Note that the circuit activity stops after a short time, and voltage starts restoring slowly. In this column 602 of the diagram 600, the clock frequency is slow enough that by the time the next clock edge happens, the voltage has been fully or close to fully restored.

Column 604 of the timing diagram 600 illustrates the effect of voltage droop on the circuit during at-speed testing. In this column 604 of the diagram 600, the clock frequency is so fast that the voltage is not fully restored when the next clock edge happens, as can be seen in the internal voltage signal 608 of column 604. The effect is that each subsequent clock edge occurs at a slightly lower voltage than the one before. Note that for real system operation, the voltage droop does not continue indefinitely. Rather, once voltage reaches a certain threshold, other mechanisms may activate to pump more current into the chip to restore the voltage. In other words, the voltage droop phenomenon associated with the clocks is only related to clock-start operation. Since structural testing is fundamentally based on starting with clocks in off state, then suddenly releasing a fixed number of clock pulses, at-speed structural testing may be affected by voltage droop, particularly in those instances where four or more PLL clock pulses are released. As shown in column 604, the internal voltage 608 during the third and fourth clock pulse 610 is significantly less than the steady-state internal voltage. This drop in internal voltage of the circuit may degrade the accuracy and reliability of the tests being conducted on the circuit. In other words, due to the voltage droop effect, at-speed testing of the circuit is testing different parts of the circuit using different test conditions.

To combat the voltage droop effect, a test incorporating fast-speed clock cycles and slow-speed clock cycles may be utilized. In particular and as shown in column 606 of the diagram 600, a clocking scheme may be utilized in which the four clock pulses are not at the same speed. Rather, utilizing the test toggle signal 612 to toggle between a fast-clock test and a slow-clock test, a combination or mix of fast clock pulses and slow clock pulses may be utilized to reduce the voltage droop of the circuit. For example, column 606 illustrates one embodiment that uses four clock pulses 610 released as slow-slow-fast-fast pattern. Stated differently, by de-asserting the at-speed mode signal 612 for two clock cycles and then re-asserting the at-speed mode signal for another two clock cycles, the voltage droop 608 experienced by the circuit during the third clock cycle is not observing a significant voltage droop. The difference in voltage droop 608 between the at-speed only test (column 604) and the combination slow-speed, at-speed test (column 606) is illustrated in the diagram as delta 614. As can be seen, the combination test diminishes the voltage droop effect for a structural test of the circuit and provides a more accurate test result.

Figure 7:
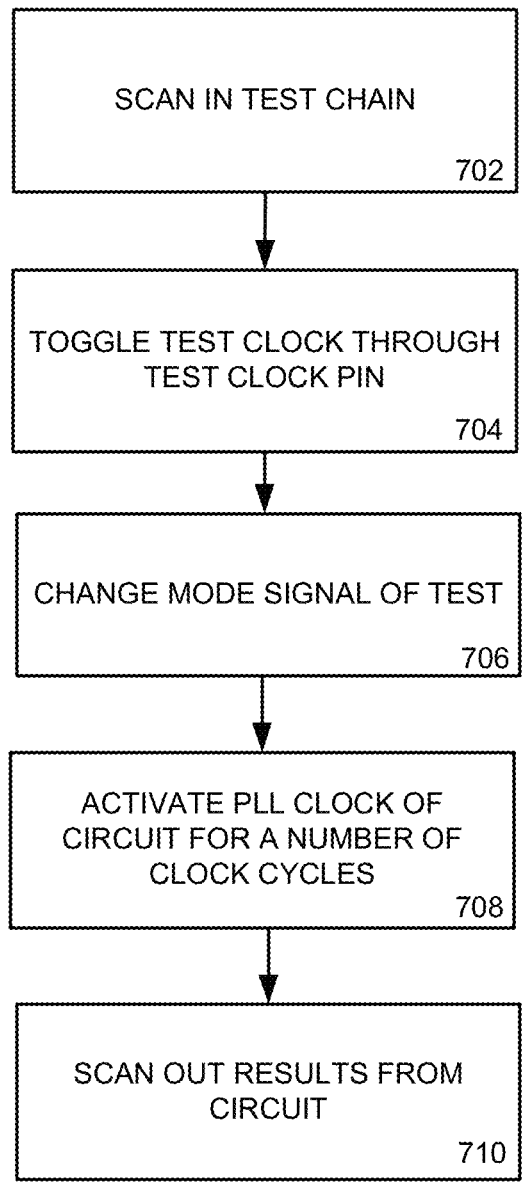
FIG. 7 is a flowchart of an embodiment of mixing high speed and low speed clock signals for a single test pattern during structural testing of a digital circuit.

FIG. 7 is a flowchart of a method for mixing high speed and low speed clock signals during structural testing of a digital circuit to increase the precision and efficiency of the structural testing. In general, the operations of FIG. 7 are performed by a testing device connected to a circuit under test. The testing device may utilize hardware components, software programs, or a combination of hardware and software to perform the operations described. The operations of FIG. 7 illustrate the advantages of the mixed clock-speed test discussed above with reference to column 606 of FIG. 6.

As should be appreciated from the above description, an improved at-speed test of a component without a scan feature would include one or more clock pulses at a slow speed (or low frequency) to place the component in the proper state, followed by two or more clock pulses at a fast speed (or high frequency) to perform the at-speed testing. In this manner, the initial clock pulses used to set up the initial conditions for the at-speed cycle would not negatively affect the voltage during the at-speed cycle. Mixing of slow speed and high speed clock signals to a circuit under test is thus possible through the method illustrated in FIG. 7.

Beginning in operation 702, the testing device 110 may scan in a test pattern into the circuit 102 under test. However, in those circuits or circuit components that do not have a scan-in feature, the testing device 110 may set up the test pattern at the input(s) to the circuit or component by application of slow clock pulses as described below. In operation 704, the testing device 110 toggles the clock pin 103 of the circuit 102 to create one or more slow clock pulses to the circuit. In one embodiment, the testing device 110 may toggle the clock pin 103 by providing an asserted then de-asserted signal on the pin. In another embodiment, the testing device 110 may provide an input signal to the CCU 112 of the circuit 102 to instruct the CCU to provide one or more slow clock pulses to the circuit. The number of slow clock pulses toggled by the testing device 110 may be determined by the number of clock pulses needed to propagate the test pattern into the proper position in the circuit or component. In general, the application of the one or more slow clock pulses to the circuit 102 is referred to as a first clocking mode of the structural testing of the circuit.

In operation 706, the testing device 110 changes the testing mode of the circuit 102. In one embodiment, the testing device 110 provides a mode select signal to the circuit to indicate to the circuit that the structural device is changing from a first mode to a second mode. The mode select signal may operate as an enable signal provided by the testing device 110 to the circuit 102 to initiate at-speed testing with a fast speed clock signal.

Once the mode of the testing is altered, the testing device 110 conducts at-speed testing of the circuit 102 by utilizing the clock signal internal to the circuit. In one embodiment, this internal clock is a PLL clock signal. In particular, the testing device 110 provides one or more control signals to the CCU 112 or other portion of the circuit 102 to instruct the clock generating circuit to release two or more clock pulses into the circuit. These fast speed clock pulses provide at-speed testing for the component or circuit 102 for a number of clock pulses, as determined by the testing program executed by the testing device. In one embodiment, the number of clock pulses is provided to the circuit through a clock count control signal. Further, the at-speed testing of the circuit 102 is more precise as the test voltage has not degraded by the earlier fast clock pulses which are used to set up the test pattern at the proper place. In this manner, the fast clock pulses are only used when needed in the exercising the at-speed cycle, in order to negatively affect the voltage of the circuit 102.

In operation 710, the resulting pattern is scanned out of the circuit 102 by the testing device 110. Again, in those circuits or circuit components that do not have a scan feature, the result of the test may include application of one or more clock pulses to propagate the result to a circuit point with scan function. These clock pulses may be slow clock pulses or fast clock pulses as desired by the testing device or test administrator. In other words, the clock control scheme outlined herein allows an arbitrary mixing of fast clock pulses and slow clock pulses for a given test pattern, to customize the testing program to make the structural test more precise and efficient.

Figure 8A:
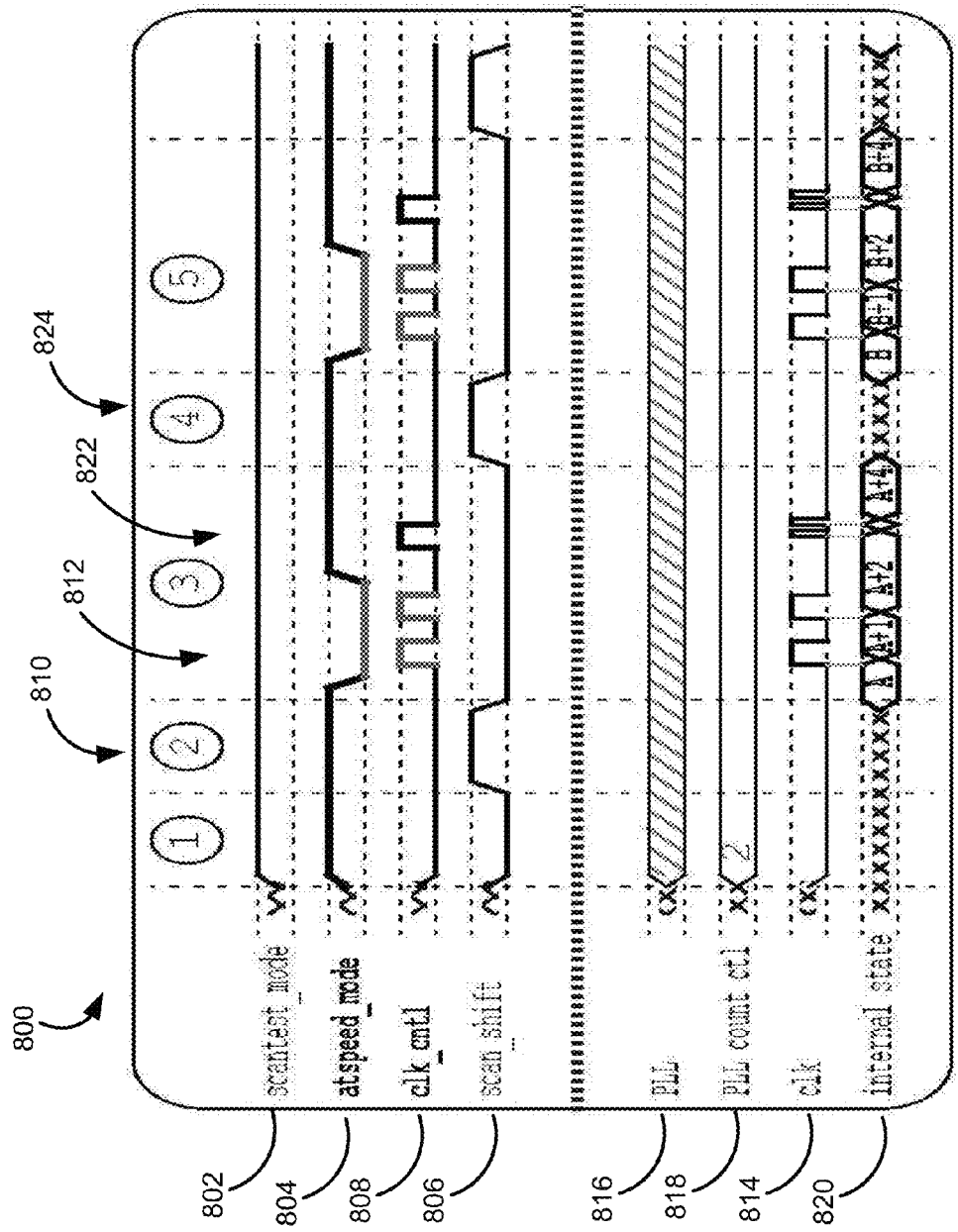
FIGS. 8A-8C are timing diagrams illustrating the signals utilized in the embodiment of mixing high speed and low speed clock signals for a single test pattern during structural testing of a digital circuit, in order to account for voltage droop.

FIG. 8A is a timing diagram 800 illustrating the signals utilized in one embodiment of mixing high speed and low speed clock signals during structural testing of a digital circuit. The timing diagram 800 is one example of the signals generated during performance of the method outlined in FIG. 7 above. As such, the testing device 110 may provide or otherwise control many of the signals illustrated in the timing diagram 800.

In the example shown, the testing device 110 or testing program provides an asserted scan test mode signal 202 that indicates that the circuit is undergoing scan testing. Initially, the at-speed mode signal 804 is asserted indicating that the circuit is in at-speed clocking mode. At time 810, the testing device 110 or program provides an asserted scan shift signal 806 that begins the process of scanning in the test pattern into the circuit. Once the test pattern is scanned in, the combination of fast-speed and slow-speed clocking of the circuit occurs. In particular, at time 812, the testing device 110 de-asserts the at-speed mode signal 804. This places the circuit in stuck-bit clocking mode, allowing for the testing device to control the clock signal 814 to the circuit under test. As such, the testing device 110 asserts a clock control signal 808 to the circuit to propagate the test pattern through the circuit. In the embodiment shown, two clock control pulses are transmitted to the circuit to advance the state twice. In one particular example, this may be done to propagate the test pattern into one or more components of the circuit that do not have a scan feature, such as SRAM components of the circuit.

Once the initial conditions for the at-speed test are set up, the at-speed test of the circuit may occur. Thus, the testing device 110 may assert the at-speed mode signal 804 to place the circuit in at-speed clocking mode. At time 822, the testing device 110 provides a pulse on the clock control signal 808. This, in turn, triggers two PLL clock pulses on the circuit clock 814. As explained above, two clock pulses are triggered in response to the clock control pulse 808 because PLL count control signal 818 include the value of "2". A different value on the PLL count control signal 818 would trigger a different number of PLL clock pulses. In addition, the PLL clock pulses on the clock signal 814 advance the state further in the circuit (from "A+2" to "A+4").

At time 824, the scan shift signal 806 is asserted to scan out the results of the testing and a new test pattern may be scanned into the circuit. The result of the test may then be analyzed by the testing device 110 to determine if the circuit 102 is operating properly. In this manner, a series of test patterns may be scanned into the circuit doing slow speed set-up, followed by fast speed test of a cycle. Further, by testing the circuit in this manner, negative effects of the operating circuit may be minimized, such as voltage droop. In particular, test patterns for components that do not have a scan feature may be at-speed tested with less voltage droop effect by utilizing stuck-bit clocking to set up initial conditions, and then performing at-speed testing on the component. By utilizing the testing scheme outlined herein, the test may be alternated between fast clock pulses and slow clock pulses to customize the testing program to make the structural test more precise and efficient.

Further, it is not required that the mixed speed test include a slow-slow-fast-fast pattern. Rather, through the use of the control signals, any combination of fast-clock pulses and slow-clock pulses may be used during testing. For example, the control signals allow for a slow-fast-fast-slow, or fast-fast-slow-slow clock pattern. Also, the mixed test may include any number of slow-clock pulses and any number of fast-clock pulses. In general, any type of test utilizing mixed clock speed signals is contemplated through the mechanisms described herein.

Figure 8B:
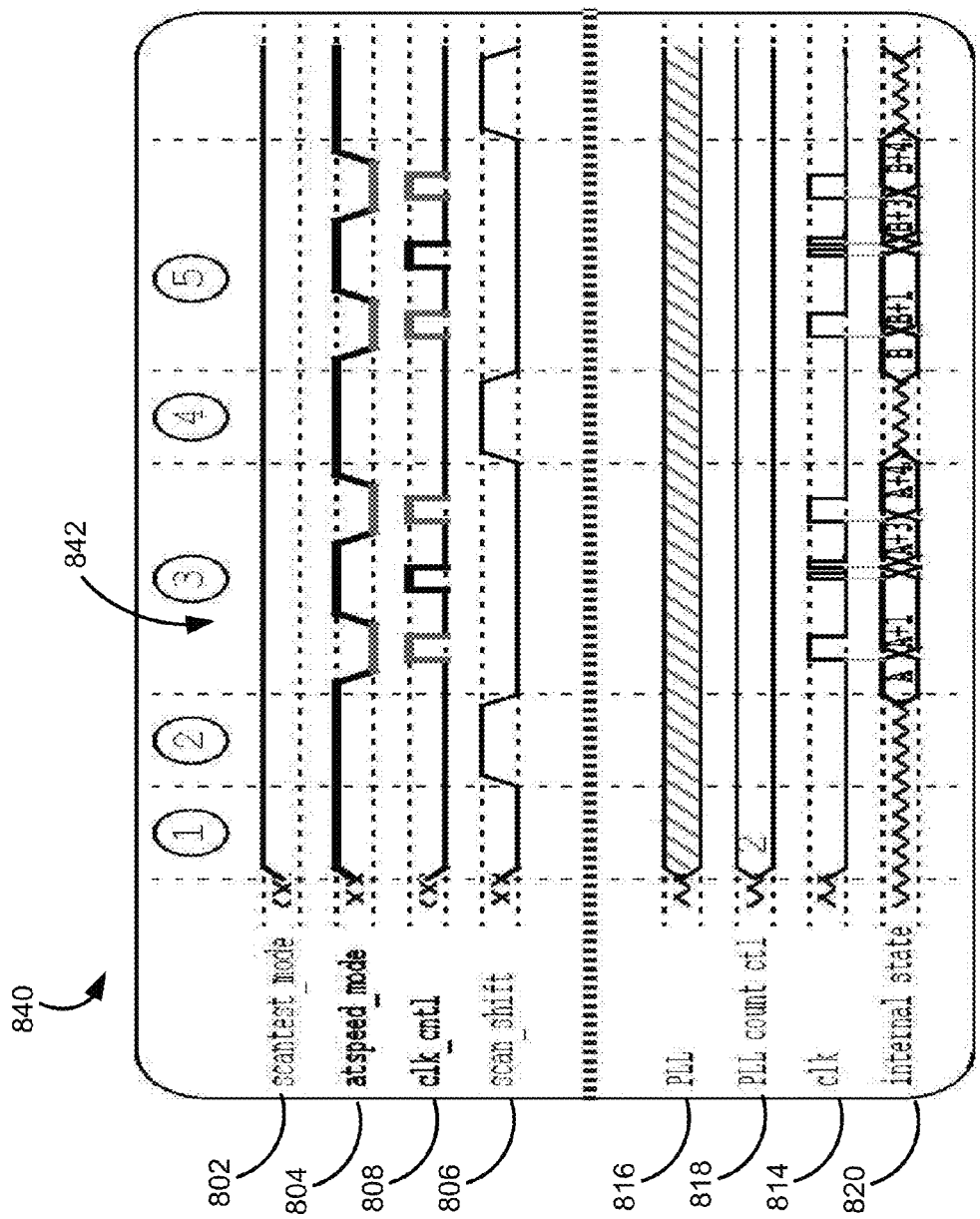
Figure 8C:
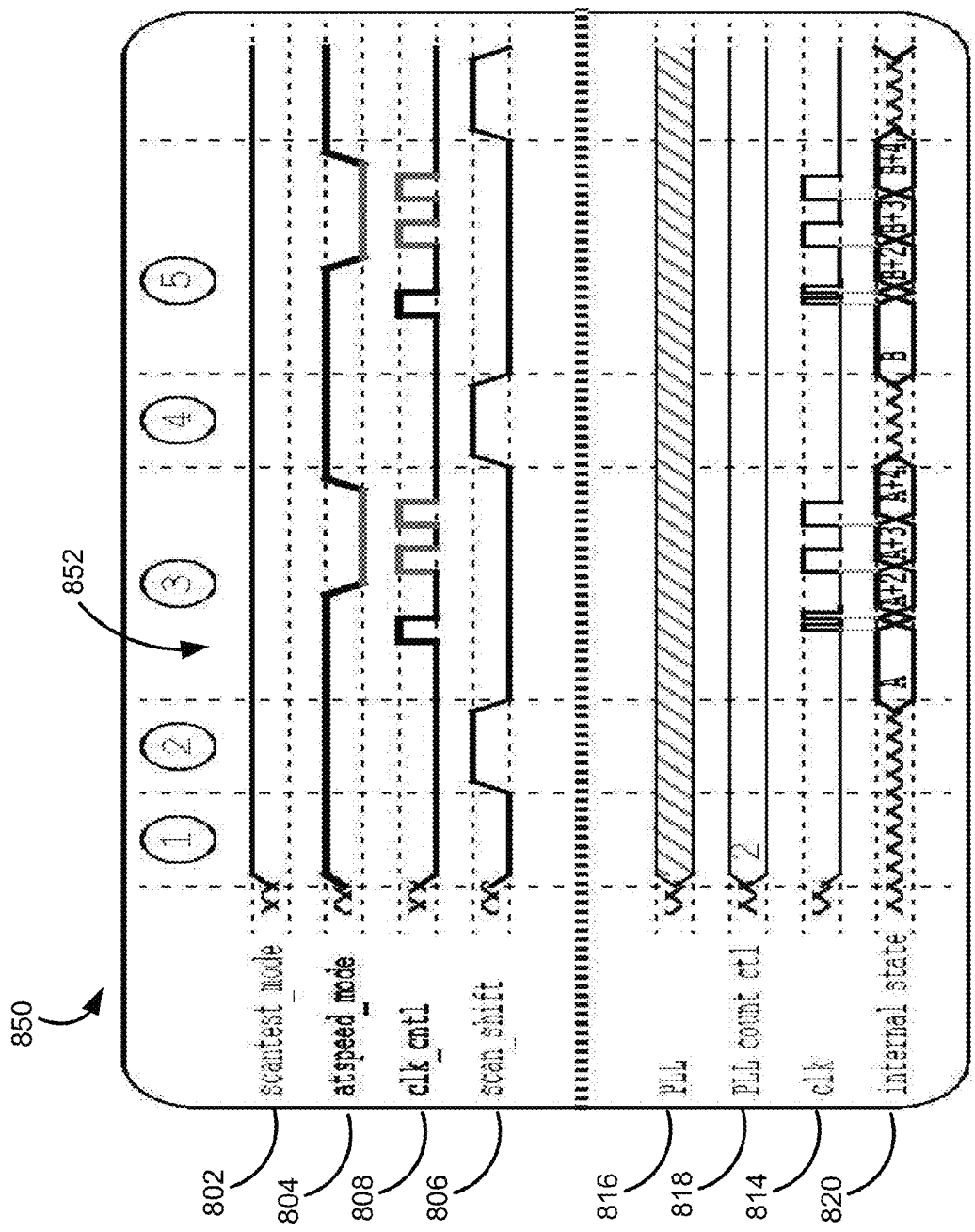

For example, the slow-slow-fast-fast clocking pattern discussed above with reference to FIG. 8A only exercises the third cycle of the test at-speed. However, in some instances, the test of the circuit may perform at-speed testing of the other two cycles. In particular, FIG. 8B illustrates a timing diagram 840 of a clocking sequence for at-speed testing of a second clock cycle. The signals of the timing diagram 840 of FIG. 8B are the same as those discussed above with reference to FIG. 8A. As shown, at time 842, a slow clock pulse is transmitted to the circuit, followed by two fast clock pulses and another slow clock pulse. Thus, the test illustrated in FIG. 8B includes a slow-fast-fast-slow pattern to at-speed test the second cycle. Similarly, FIG. 8C illustrates a timing diagram 850 of a clocking sequence for at-speed testing of a first clock cycle by providing, at time 852, two fast clock pulses followed by two slow clock pulses. Thus, the test illustrated in FIG. 8C includes a fast-fast-slow-slow pattern to at-speed test the first cycle. In this manner, each of the cycles of the test may be at-speed tested by varying the combination of fast and slow clock pulses provided to the circuit.

Figure 9:
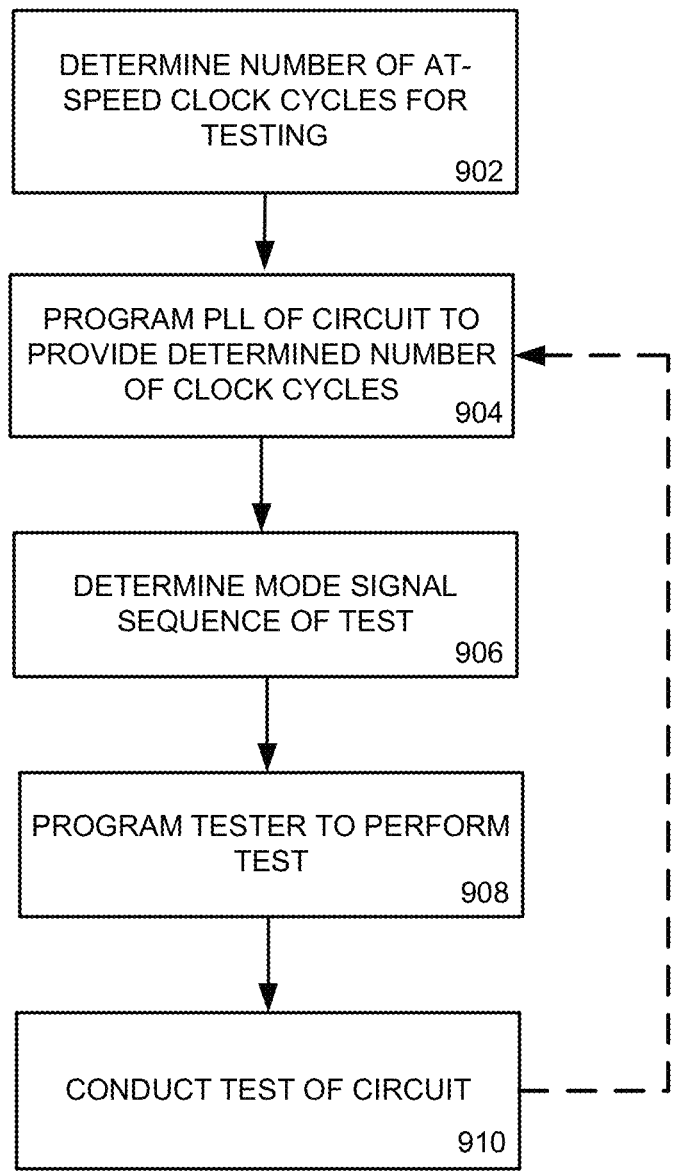
FIG. 9 is a flowchart of a method for a testing device to perform one embodiment of a test that mixes high speed and low speed clock signals during structural testing of a digital circuit.

Further, although the timing diagram 800 of FIGS. 8A-8C use two PLL clock pulses, using additional control signal, and/or additional programming, the testing device may alter the number of clock pulses released by the internal clock during the at-speed testing portions of the mode switching test. For example, two PLL clock pulses may be released during a first at-speed portion of the test and four PLL clock pulses may be released during a second at-speed portion of the test. In particular, FIG. 9 is a flowchart of a method for a testing device to perform one embodiment of a test that mixes high speed and low speed clock signals during structural testing of a digital circuit. The method of FIG. 9 may also be used to change the parameters of the at-speed testing portion of a mixed mode testing of the circuit, as described in more detail below.

The operations of FIG. 9 are performed by the testing device to test a digital circuit or electronic device. The testing device may utilize hardware components, software programs, or a combination of hardware and software to perform the operations described. Beginning in operation 902, the testing device determines the number of at-speed clock cycles to be used to conduct at-speed testing on the circuit. In general, any number of clock cycles of the internal clock signal may be utilized to conduct at-speed testing. Typically, the number of clock cycles is more than two clock cycles. Further, the testing device need not begin the testing of the circuit with at-speed (or fast speed) clocks. Rather, stuck-bit (or slow speed) clocks may be applied first on the circuit.

Figure 10:
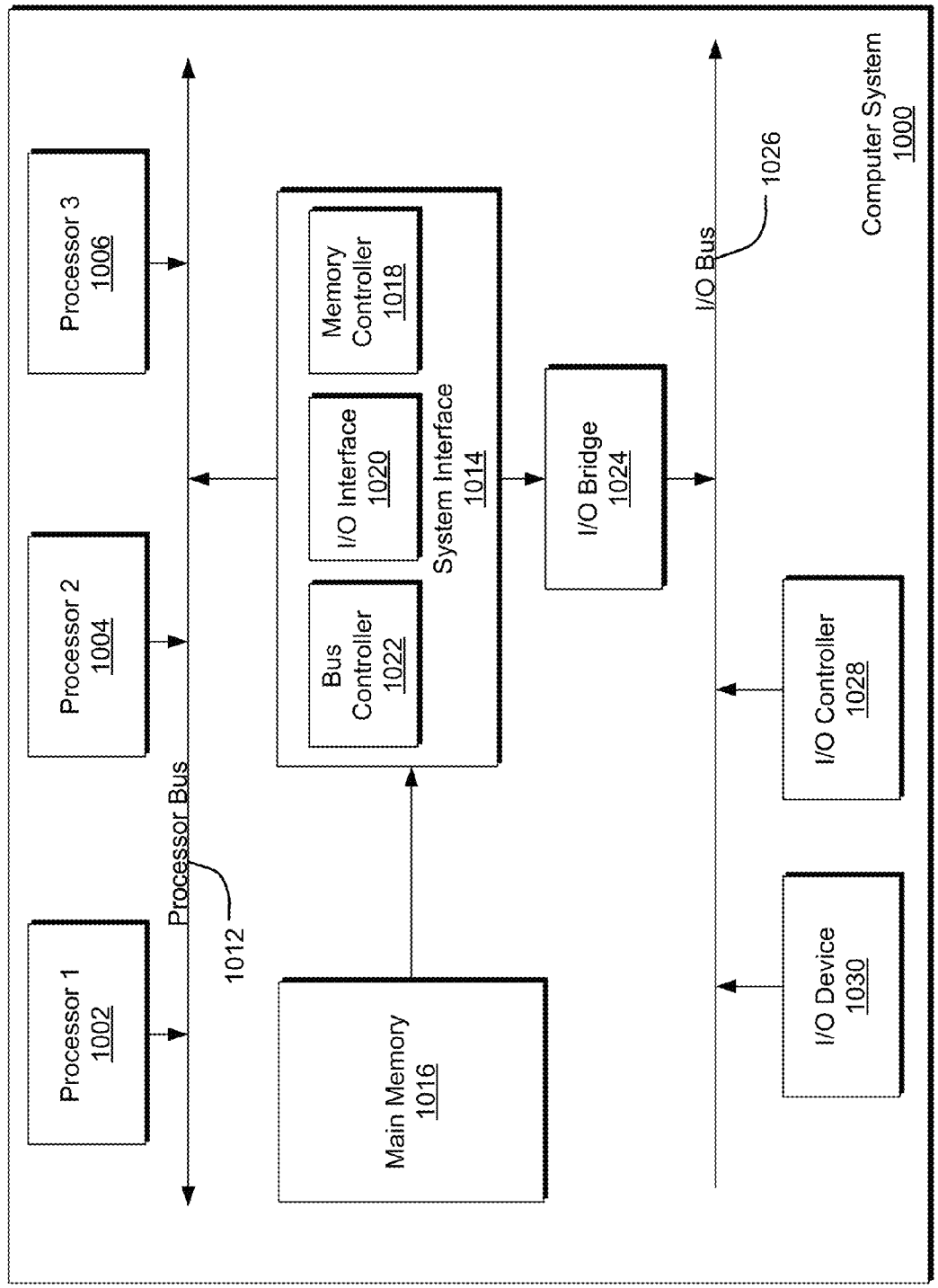
FIG. 10 is a block diagram illustrating an example of a computing system which may be used in implementing embodiments of the present disclosure.

In operation 904, the testing device provides one or more control signals to the circuit to program the internal clock circuit of the circuit under test. In general, the internal clock circuit (in one example, the PLL clock) is programmed to provide a particular number of clock cycles from the clock circuit. For example, the clock circuit illustrated in the timing diagram 1000 of FIG. 10 is programmed to release two clock cycles of the internal clock signal. Any number of such cycles may be programmed to be released by the internal clock signal when an initiation signal is received from the testing device.

In operation 906, the testing device determines the mode sequence for the circuit testing program. The mode sequence determines which clock mode (at-speed clocking or stuck-bit clocking) is performed on the circuit at which time during the test program. In general, the test program may switch between the two modes of clocking any number of times and in any sequence. In operation 908, the testing device programs a testing program to execute the test on the circuit. The testing program may include the mode sequence and internal clock program discussed above. In operation 910, the circuit is placed under test based at least on the testing program created by the testing device.

In one embodiment, the testing of the circuit is performed in this manner, utilizing two modes of clocking without resetting the clock control logic between the two modes. In another embodiment, the testing device may alter the number of internal clock cycles are released by the internal clock during at-speed testing. In particular and in reference to FIG. 9, the testing device may return to operation 904 after the testing of the circuit is executed for some time. The testing device may then perform operation 904 through operation 910 to alter the number of internal clock cycles released by the internal clock circuit. In other words, testing of the circuit may be suspended while the testing device alters the number of internal clock pulses released during at-speed testing of the circuit. However, the test control logic of the circuit does not need to be reset to alter the number of at-speed test clock cycles. Further, because such adjusting may occur during stuck-bit or slow speed testing, the performance of the test is not altered. Rather, the number of clock cycles may be adjusted or altered during the testing of the circuit, providing additional flexibility and features to the testing scheme. As such, multi-mode clocking (slow speed and fast speed clocking) of a circuit may be accomplished that increases the testing precision and efficiency over previous testing schemes.

FIG. 10 is a block diagram illustrating an example of a computing device or computer system 1000 which may be used in implementing the embodiments of the structural testing schemes of a circuit design disclosed above. For example, the testing device described above for conducting testing on a circuit may be similar to the computing device of FIG. 10. The computer system (system) includes one or more processors 1002-1006. Processors 1002-1006 may include one or more internal levels of cache (not shown) and a bus controller or bus interface unit to direct interaction with the processor bus 1012. Processor bus 1012, also known as the host bus or the front side bus, may be used to couple the processors 1002-1006 with the system interface 1014. System interface 1014 may be connected to the processor bus 1012 to interface other components of the system 1000 with the processor bus 1012. For example, system interface 1014 may include a memory controller 1018 for interfacing a main memory 1016 with the processor bus 1012. The main memory 1016 typically includes one or more memory cards and a control circuit (not shown). System interface 1014 may also include an input/output (I/O) interface 1020 to interface one or more I/O bridges or I/O devices with the processor bus 1012. One or more I/O controllers and/or I/O devices may be connected with the I/O bus 1026, such as I/O controller 1028 and I/O device 1030, as illustrated.

I/O device 1030 may also include an input device (not shown), such as an alphanumeric input device, including alphanumeric and other keys for communicating information and/or command selections to the processors 1002-1006. Another type of user input device includes cursor control, such as a mouse, a trackball, or cursor direction keys for communicating direction information and command selections to the processors 1002-1006 and for controlling cursor movement on the display device.

System 1000 may include a dynamic storage device, referred to as main memory 1016, or a random access memory (RAM) or other computer-readable devices coupled to the processor bus 1012 for storing information and instructions to be executed by the processors 1002-1006. Main memory 1016 also may be used for storing temporary variables or other intermediate information during execution of instructions by the processors 1002-1006. System 1000 may include a read only memory (ROM) and/or other static storage device coupled to the processor bus 1012 for storing static information and instructions for the processors 1002-1006. The system set forth in FIG. 10 is but one possible example of a computer system that may employ or be configured in accordance with aspects of the present disclosure.

According to one embodiment, the above techniques may be performed by computer system 1000 in response to processor 1004 executing one or more sequences of one or more instructions contained in main memory 1016. These instructions may be read into main memory 1016 from another machine-readable medium, such as a storage device. Execution of the sequences of instructions contained in main memory 1016 may cause processors 1002-1006 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 1016. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

It should be noted that the flowcharts of FIGS. 7 and 9 are illustrative only. Alternative embodiments of the present invention may add operations, omit operations, or change the order of operations without affecting the spirit and scope of the present invention. The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A method for testing of a microelectronic circuit comprising:
   scanning in a test pattern into the microelectronic circuit through one or more inputs to the microelectronic circuit;
   transmitting one or more pulses of a first clock signal to the microelectronic circuit, the first clock signal being from a first clock source to the microelectronic circuit;
   prior to scanning out a final value of the transmitted one or more pulses of the first clock signal:
      asserting a mode change signal associated with the microelectronic circuit, the mode change signal indicating a change in clocking logic applied to the microelectronic circuit;
      enabling a second clock signal to the microelectronic circuit, the second clock signal being from a second clock source to the microelectronic circuit, the second clock source different than the first clock source; and
      transmitting one or more pulses of the second clock signal to the microelectronic circuit; and
      scanning out the final value and comparing the final value to an expected result.

2. The method of claim 1 wherein the first clock source is an external clock source and transmitting the first clock signal comprises asserting and de-asserting a clock pin associated with the microelectronic circuit.

3. The method of claim 1 wherein the second clock source is an internal clock source and the second clock signal is generated by at least one of a phase locked loop circuit, a delay-locked-loop circuit or a frequency-locked-loop circuit.

4. The method of claim 3 wherein the second clock source is locked to a first frequency at a first time and a second frequency, different than the first frequency, at a second time.

5. The method of claim 3 wherein the second clock source is selected from a plurality of internal clock sources, wherein at least two of the plurality of internal clock sources have different frequencies.

6. The method of claim 1 wherein the mode change signal associated with the microelectronic circuit is received from a testing device in communication with the microelectronic circuit.

7. The method of claim 1 further comprising:
   de-asserting the mode change signal associate with the microelectronic circuit; and
   transmitting one or more pulses of a third clock signal to the microelectronic circuit, the third clock signal being from the first clock source to the microelectronic circuit.

8. The method of claim 7 wherein the second clock signal comprises a first number of clock cycles, the method further comprising:
   programming the second clock source of the microelectronic circuit to comprise a second number of clock cycles different than the first number of clock cycles.

9. The method of claim 1 wherein the first clock signal has a first frequency and the second clock signal has a second frequency that is greater than the first frequency.

10. A computer system, comprising:
    a microelectronic circuit coupled to a testing device for conducting testing of circuit designs, the microelectronic circuit comprising a plurality of clock domains, each clock domain within the plurality comprising one or more test control circuits and an operating clock component;
    wherein the testing device electrically connects to the microelectronic circuit and is configured to:
       scan in a test pattern into the microelectronic circuit through one or more inputs to the microelectronic circuit;
       transmit one or more pulses of a first clock signal to the microelectronic circuit, the first clock signal being from a first clock source to the microelectronic circuit;

prior to scanning out a final result of the transmitted one or more pulses of the first clock signal:
assert a mode change signal associated with the microelectronic circuit, the mode change signal indicating a change in a clocking mode applied to the microelectronic circuit;
enable a second clock signal to the microelectronic circuit, the second clock signal being from a second clock source to the microelectronic circuit, the second clock source different than the first clock source;
transmit one or more pulses of the second clock signal to the microelectronic circuit; and
compare a received result value to an expected result.

11. The computer system of claim 10 wherein the first clock source is an external clock source and the testing device is further configured to:
assert and de-assert a clock pin associated with the microelectronic circuit to create the first clock signal.

12. The computer system of claim 10 wherein the second clock source is created by an operating clock component of at least one of the plurality of clock domains of the microelectronic circuit.

13. The computer system of claim 12 wherein the operating clock component of the at least one of the plurality of clock domains of the microelectronic circuit is at least one of a phase locked loop circuit, a delay-locked-loop circuit or a frequency-locked-loop circuit.

14. The computer system of claim 12 wherein the second clock source generates a first frequency at a first time and a second frequency, different than the first frequency, at a second time.

15. The computer system of claim 12 wherein the second clock source is selected from a plurality of internal clock sources, wherein at least two of the plurality of internal clock sources have different frequencies.

16. The computer system of claim 10 wherein the testing device is further configured to:
transmit the mode change signal to the microelectronic circuit to indicate the change in the clocking mode applied to the microelectronic circuit.

17. The computer system of claim 10 wherein the testing device is further configured to:
de-assert the mode change signal associate with the microelectronic circuit; and
transmit one or more pulses of a third clock signal to the microelectronic circuit, the third clock signal being from the first clock source to the microelectronic circuit.

18. The computer system of claim 15 wherein the testing device is further configured to:
assert and de-assert a clock pin associated with the microelectronic circuit to create the third clock signal.

19. The computer system of claim 18 wherein the second clock signal comprises a first number of clock cycles and the testing device is further configured to program the second clock signal of the microelectronic circuit to comprise a second number of clock cycles different than the first number of clock cycles.

20. The computer system of claim 10 wherein the first clock signal has a first frequency and the second clock signal has a second frequency that is greater than the first frequency.

* * * * *